(12) United States Patent
Sakka et al.

(10) Patent No.: US 10,998,168 B2
(45) Date of Patent: May 4, 2021

(54) PLASMA PROCESSING APPARATUS

(71) Applicant: HITACHI HIGH-TECHNOLOGIES CORPORATION, Tokyo (JP)

(72) Inventors: Yusaku Sakka, Shunan (JP); Ryoji Nishio, Kudamatsu (JP); Tadayoshi Kawaguchi, Kudamatsu (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/669,711

(22) Filed: Oct. 31, 2019

(65) Prior Publication Data

US 2020/0066487 A1 Feb. 27, 2020

Related U.S. Application Data

(62) Division of application No. 13/363,427, filed on Feb. 1, 2012, now Pat. No. 10,541,115.

(30) Foreign Application Priority Data

Oct. 5, 2011 (JP) .............................. JP2011-220611

(51) Int. Cl.
 *H01J 37/32* (2006.01)
(52) U.S. Cl.
 CPC ..... *H01J 37/3211* (2013.01); *H01J 37/32651* (2013.01)
(58) Field of Classification Search
 CPC ............ H01J 37/3211; H01J 37/32651; H01J 37/32623; H01L 21/3065
 See application file for complete search history.

(56) References Cited

U.S. PATENT DOCUMENTS 6,666,982 B2 * 12/2003 Brcka ................. C23C 14/3471
                                                          118/723 I
2005/0103445 A1   5/2005  Brcka et al.
2006/0175016 A1   8/2006  Edamura et al.

FOREIGN PATENT DOCUMENTS

JP          08-227800 A     9/1996
JP        2001-085195 A     3/2001
                (Continued)

OTHER PUBLICATIONS

Office Action, dated Jun. 9, 2015, which issued during the prosecution of Japanese Patent Application No. 2011-220611, which corresponds to the present application (partial English translation attached).

*Primary Examiner* — Yuechuan Yu
(74) *Attorney, Agent, or Firm* — Baker Botts L.L.P.

(57) ABSTRACT

In a plasma processing apparatus that can adjust an induction magnetic field distribution of power feeding sections of an induction coil, correct a plasma distribution on a specimen, and apply uniform plasma processing to the specimen, the specimen is subjected to plasma processing, a dielectric window that forms the upper surface of the vacuum processing chamber, a gas lead-in section that leads gas into the vacuum processing chamber, a specimen table that is arranged in the vacuum processing chamber and on which the specimen is placed, an induction coil provided above the dielectric window, and a radio-frequency power supply that supplies radio-frequency power to the induction coil. The plasma processing apparatus includes a flat conductor arranged below the induction coil. The induction coil includes crossing power feeding sections. The conductor is arranged below the power feeding sections.

4 Claims, 11 Drawing Sheets

(56) References Cited

FOREIGN PATENT DOCUMENTS

| | | |
|---|---|---|
| JP | 2006-216903 A | 8/2006 |
| JP | 2007-158373 A | 6/2007 |
| JP | 2011-103346 A | 5/2011 |

* cited by examiner

INDUCTION CURRENT FLOWING IN PROCESSING CONTAINER 1b

HIGH-FREQUENCY CURRENT 13 FLOWING IN INDUCTION COIL 4

PLASMA PROCESSING APPARATUS

CLAIM OF PRIORITY

The present application is a divisional of U.S. patent application Ser. No. 13/363,427 filed on Feb. 1, 2012, which claims priority to Japanese Patent Application No. 2011-220611 filed on Oct. 5, 2011, the contents of all of which are incorporated by reference herein.

BACKGROUND OF THE INVENTION

The present invention relates to a plasma processing apparatus and, more particularly, to a plasma processing apparatus suitable for an apparatus in which an inductively coupled plasma source is used.

In the semiconductor device manufacturing field, a plasma apparatus of an inductively coupled plasma (ICP) type is also used for etching and surface processing of a specimen. As the ICP plasma processing apparatus in the past, there is known an ICP plasma processing apparatus described in JP-A-2007-158373 including a gas ring that forms a part of a vacuum processing chamber and includes a blowout port for a processing gas, a bell jar that covers an upper part of the gas ring to form the vacuum processing chamber, an antenna that is arranged in an upper part of the bell jar and supplies a radio-frequency magnetic field to the inside of the vacuum processing chamber and generates a plasma, a placing table for placing a wafer in the vacuum processing chamber, and a Faraday shield that is arranged between the antenna and the bell jar and to which a radio-frequency bias voltage is applied.

In general, in the plasma processing apparatus in which the ICP plasma source is used, it is known that a current distribution of an induction coil inevitably becomes non-uniform and plasma becomes non-uniform along the circumferential direction of the induction coil. This causes eccentricity of plasma, i.e., the center axis of the plasma diffusing on a wafer deviates from the center axis of the induction coil.

As means for solving this problem, JP-A-2011-103346 discloses a plasma processing apparatus in which a ring-like conductor substantially concentric with an induction antenna is arranged along the induction antenna. The ring-like conductor has a shape in which mutual inductance between the ring-like conductor and the induction antenna and mutual inductance between the ring-like conductor and plasma increase gradually according to the circulation in the circumferential direction of the ring-like conductor.

BRIEF SUMMARY OF THE INVENTION

Unevenness in a distribution of a plasma along a circumferential direction of an induction coil as a problem caused by unevenness in a distribution of an electric current in the induction coil, includes unevenness in the distribution of the plasma along the circumferential direction of the induction coil caused by electric power supply portions of the induction coil, but in JP-A-2011-103346, the unevenness in the distribution of the plasma along the circumferential direction of the induction coil caused by electric power supply portions of the induction coil is not considered.

Incidentally, evenness in etching treatment, a squareness or perpendicularity of a shape formed by the etching treatment, and so forth are deteriorated when the etching treatment is performed with an eccentricity of the plasma on a wafer. Therefore, at the moment, since an improvement in accuracy of the plasma treatment is highly required, the unevenness in the distribution of the plasma along the circumferential direction of the induction coil caused by the electric power supply portions of the induction coil cannot be disregarded for performing stably the etching treatment.

An object of the invention determined with making reference to the above problems, is to provide an plasma processing apparatus in which a magnetic field distribution induced at the electric power supply portions of the induction coil is adjusted to compensate the distribution of the plasma on a specimen so that the evenness of the plasma treatment on the specimen is obtained.

According to the invention, a plasma processing apparatus for processing a specimen with plasma in a gas, comprises a vacuum processing chamber for containing therein the specimen to be processed, a dielectric window forming an opening for the vacuum processing chamber, a gas supplier for supplying the gas into the vacuum processing chamber, a specimen table arranged in the vacuum processing chamber to hold thereon the specimen, an induction coil for generating a magnetic field to be applied through the opening into the vacuum processing chamber, and a radio-frequency electric power source for supplying a radio-frequency electric power to the induction coil, wherein the induction coil has a pair of electric power supply portions between which the radio-frequency electric power is capable of flowing to generate the magnetic field, and which overlap each other as seen in a direction parallel to a central axis of the induction coil, and the plasma processing apparatus further comprises an electrically conductive plate arranged to be closer to the vacuum processing chamber than the electric power supply portions in the direction and extending to overlap the electric power supply portions as seen in the direction.

Further, according to the invention, a plasma processing apparatus for processing a specimen with plasma in a gas, comprises a vacuum processing chamber for containing therein the specimen to be processed, a dielectric window forming an opening for the vacuum processing chamber, a supplier for supplying the gas into the vacuum processing chamber, a specimen table arranged in the vacuum processing chamber to hold thereon the specimen, an induction coil for generating a magnetic field to be applied through the opening into the vacuum processing chamber, a radio-frequency electric power source for supplying a radio-frequency electric power to the induction coil, and a Faraday shield arranged to be closer to the vacuum processing chamber than the induction coil in a direction parallel to a central axis of the induction coil to adjust an electric field in the vacuum processing chamber, wherein the induction coil has electric power supply portions between which the radio-frequency electric power is capable of flowing to generate the magnetic field, and which overlap each other as seen in the direction, and the Faraday shield forms slits, at least one of which slits is prevented from extending to at least partially overlap the electric power supply portions as seen in the direction, so that a part of the Faraday shield extends to overlap the electric power supply portions as seen in the direction.

According to the invention, the distribution of the magnetic field induced by the induction coil can be adjusted.

Other objects, features and advantages of the invention will become apparent from the following description of the embodiments of the invention taken in conjunction with the accompanying drawings.

DETAILED DESCRIPTION OF THE INVENTION

A plasma processing apparatus according to an embodiment of the present invention is explained below with reference to FIGS. 1 to 14.

Figure 1:
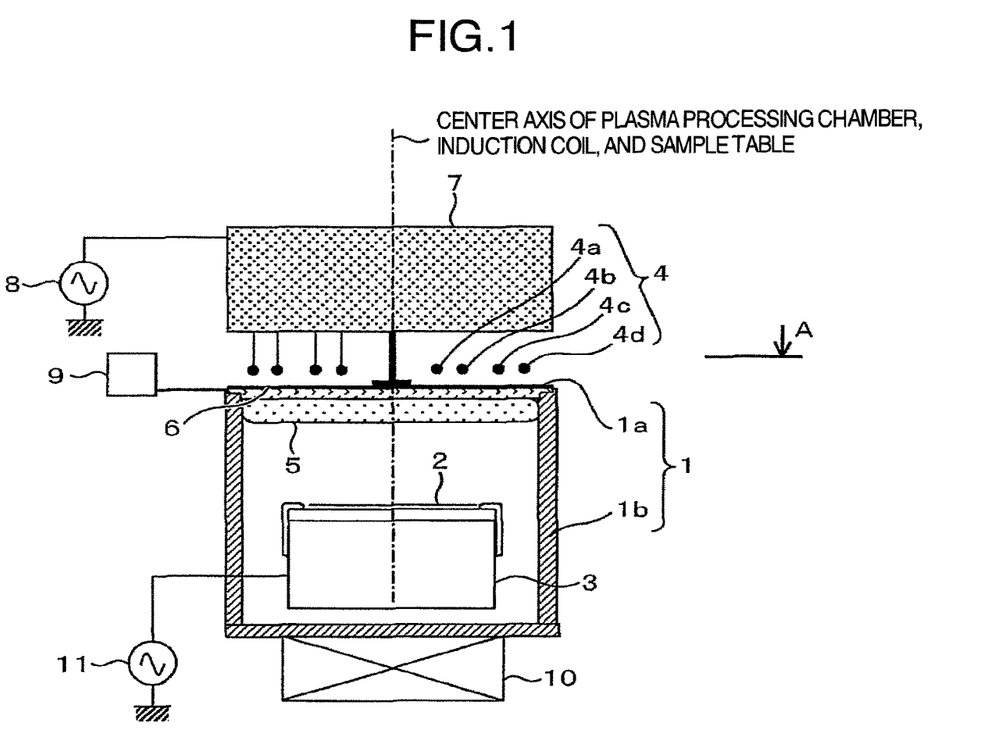
FIG. 1 is a longitudinal sectional view showing a plasma processing apparatus according to an embodiment of the present invention.
Figure 2:
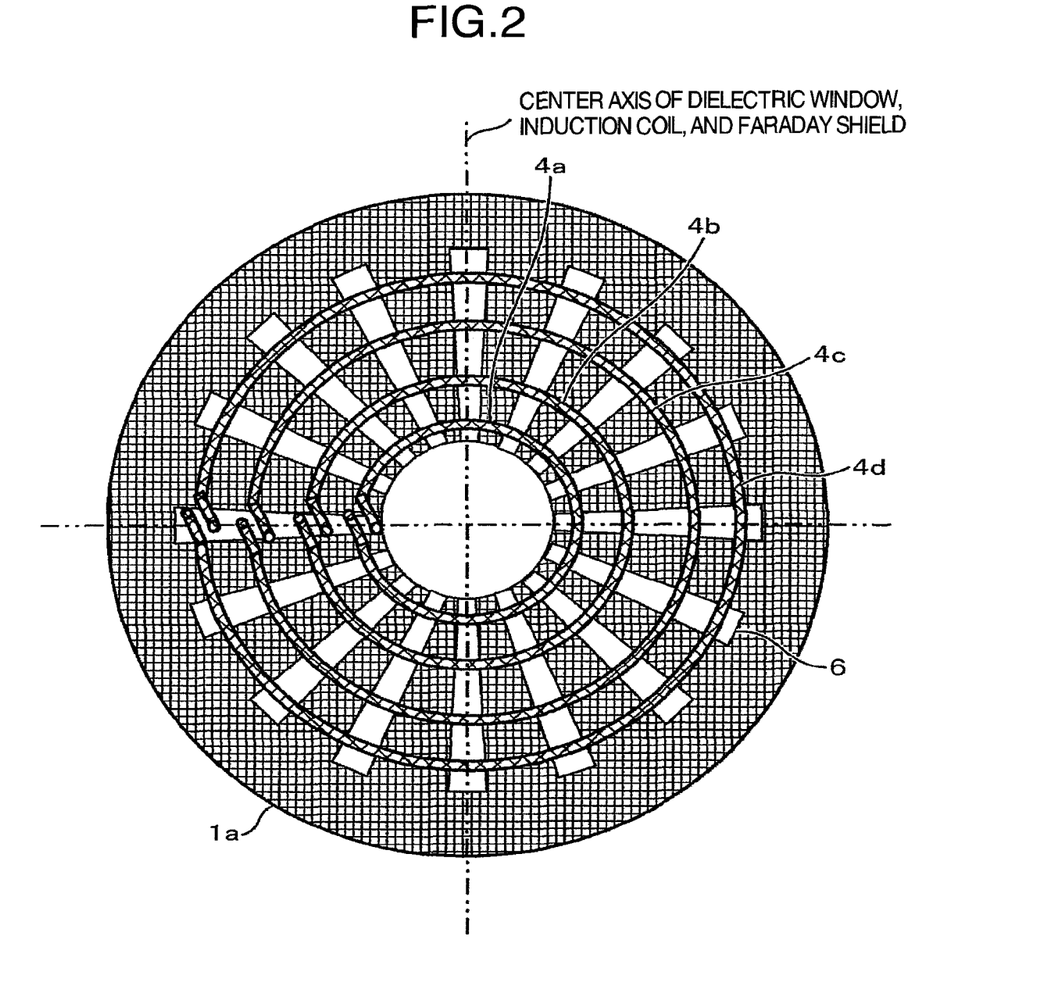
FIG. 2 is a plan view of an induction coil and a Faraday shield viewed from A in FIG. 1.
Figure 3A:
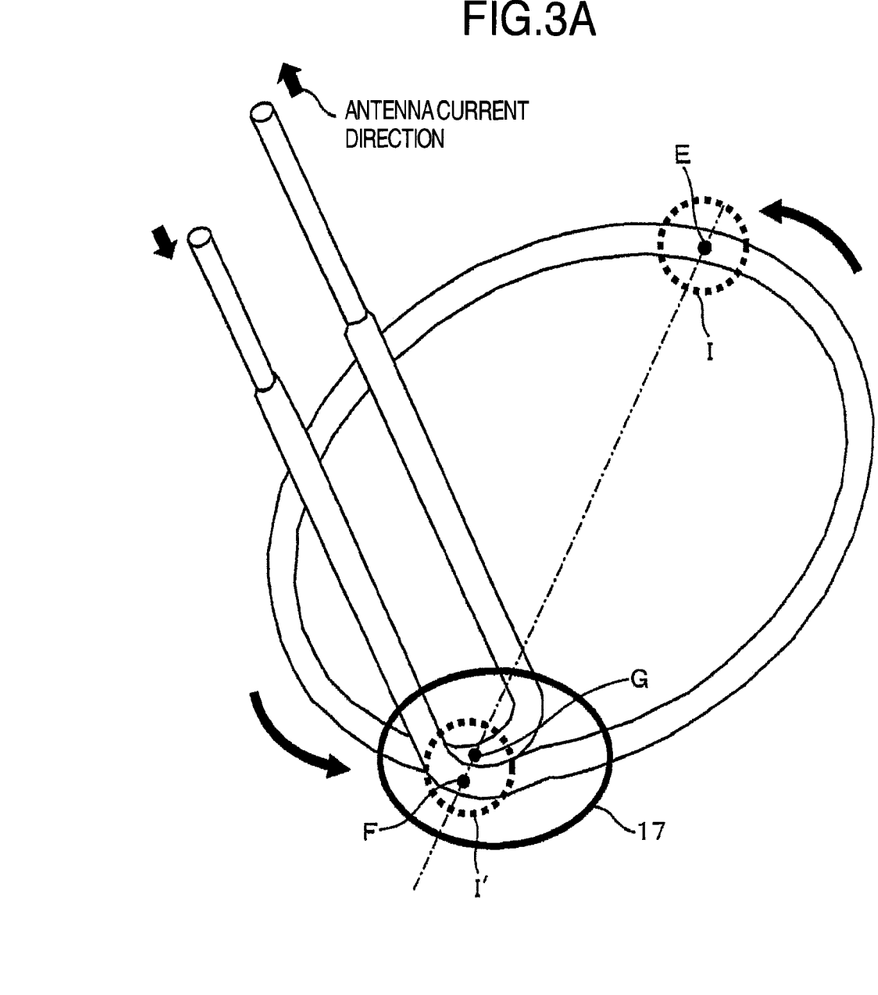
FIG. 3A is a perspective view of an induction coil according to the present invention.
Figure 3B:
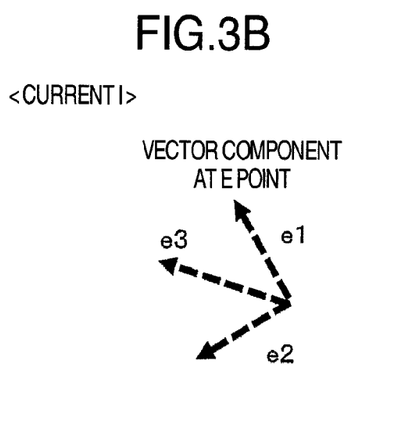
FIGS. 3B and 3C are diagrams of decomposed radio-frequency current vectors.
Figure 3C:
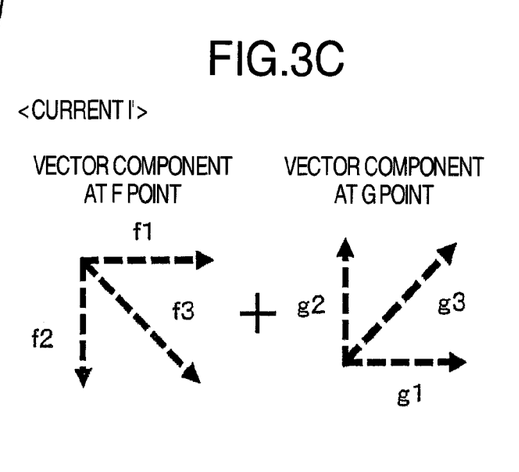

FIG. 1 is a longitudinal sectional view of a plasma processing apparatus of an inductively coupled plasma type. A dielectric window 1a, which is a top plate that can hermetically keep the inside, is attached to an upper opening of a cylindrical processing container 1b to form a vacuum processing chamber 1. The dielectric window 1a is formed of an insulating material that can transmit an electromagnetic wave, for example, a non-conductive material such as alumina (Al2O3) ceramic. An induction antenna is arranged in an upper part of the dielectric window 1a serving as the upper surface on the outer side of the vacuum processing chamber 1. In this case, in the induction antenna, as shown in FIG. 2, induction coils 4a to 4d having different inner diameters and formed by one turn are arranged on concentric circles. As shown in FIG. 3A, each of the induction coils 4a to 4d includes electric power supply ends at both ends (since a power supply is an alternate current, both the sides are the power feed ends). The induction coil is wound longer than one turn of the induction coil starting from one electric power supply end. A part of the induction coil overlaps. The electric power supply end is provided at the other end. As shown in FIG. 3A, when a radio-frequency current flows to the induction coil 4 counterclockwise, the vector of a radio-frequency current at an E point can be decomposed as shown in FIG. 3B. On the other hand, radio-frequency current vectors at an F point and a G point of a crossing section 17 of power feeding sections can be decomposed as shown in FIG. 3C. Vectors in the same direction such as f1 and g1 are present. Therefore, the crossing section 17 of the power feeding sections of the induction coil 4 can generate an induction magnetic field stronger than that in a place on the circumference of the induction coil 4 other than the crossing section 17 of the power feeding sections.

In order to prevent contact in the overlapping section, as shown in FIG. 3A, the induction coil 4 including rises of the electric power supply ends is coated with an insulating material. The induction coil 4 is connected to a first radio-frequency power supply 8 via a matching unit 7. The first radio-frequency power supply 8 generates, for example, radio-frequency power at 13.56 MHz or 27.12 MHz.

Figure 4:
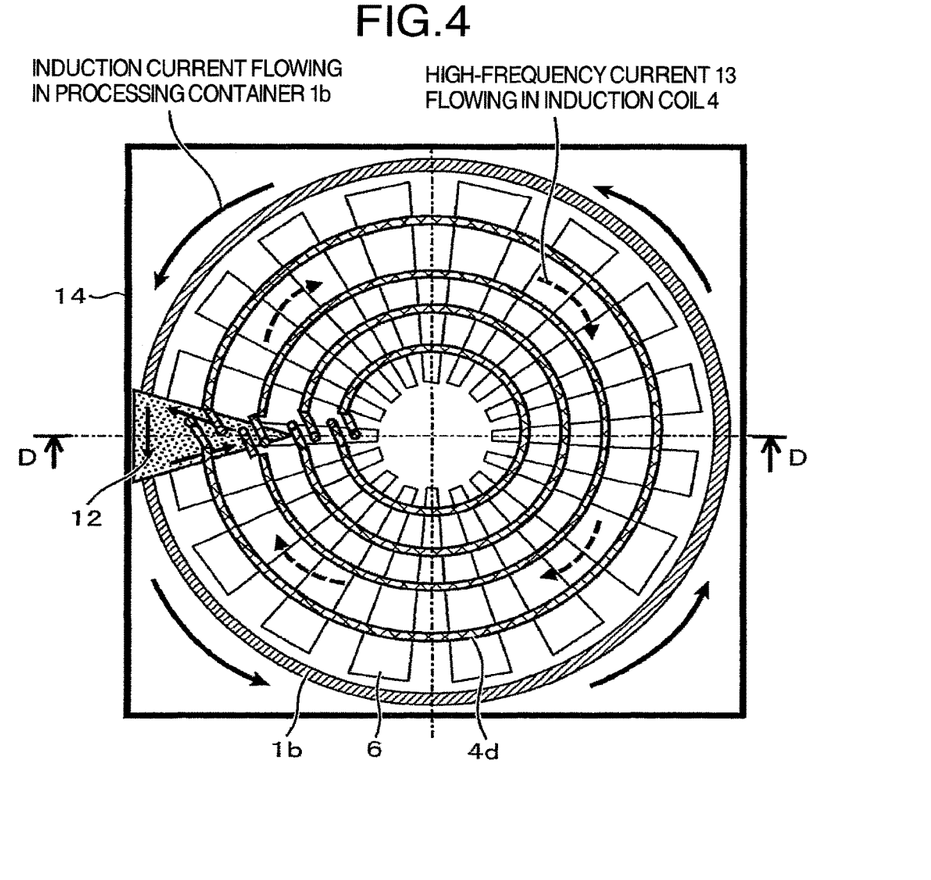
FIG. 4 is a plan view of a conductor, an induction coil and a Faraday shield according to the present invention.

A Faraday shield 6 is arranged between the induction coil 4 and the dielectric window 1a. In this case, the Faraday shield 6 is attached to the upper surface of the dielectric window 1a. The Faraday shield 6 is formed of a conductor. The Faraday shield 6 continues in the circumferential direction respectively in the center and the outer circumference as shown in FIG. 2. The Faraday shield 6 is formed to have radial slits in a region between the center and the outer circumference. The dielectric window 1a, the Faraday shield 6, and the induction coil 4 are attached in parallel on the concentric circles and at a predetermined interval. As shown in FIG. 4, on the upper surface of the Faraday shield 6 as a side of the Faraday shield 6 opposite to another side of the Faraday shield 6 facing to the dielectric window 1a, a tabular conductor 12 is arranged in a lower part near the power feeding sections (the electric power supply ends) of the induction coil 4d.

The shape of the conductor 12 is a triangular shape tapered toward the center from the processing container 1b that forms a processing chamber. When a radio-frequency current 13 flowing to the induction coil 4d is in a direction of a dotted line arrow in FIG. 4 (clockwise), an induction current in the opposite direction (counterclockwise) flows to the processing container 1b. An induction magnetic field in a direction for cancelling the strong induction magnetic field of the power feeding sections is generated in the conductor 12. Therefore, it is possible to reduce the induction magnetic field generated from the power feeding sections. The conductor 12 is made of a material such as aluminum, stainless steel, or copper.

In this case, the Faraday shield 6 is formed to prevent the outer circumference from being connected by the conductor and prevent an induction current (a circulating current) in the opposite direction from flowing near the induction coil 4d. This makes it possible to locally correct the distribution of the induction magnetic field transmitted through the dielectric window in the power feeding sections of the induction coil 4d and substantially uniformly correct the induction magnetic field distribution in the entire range of the induction coil 4.

Figure 5:
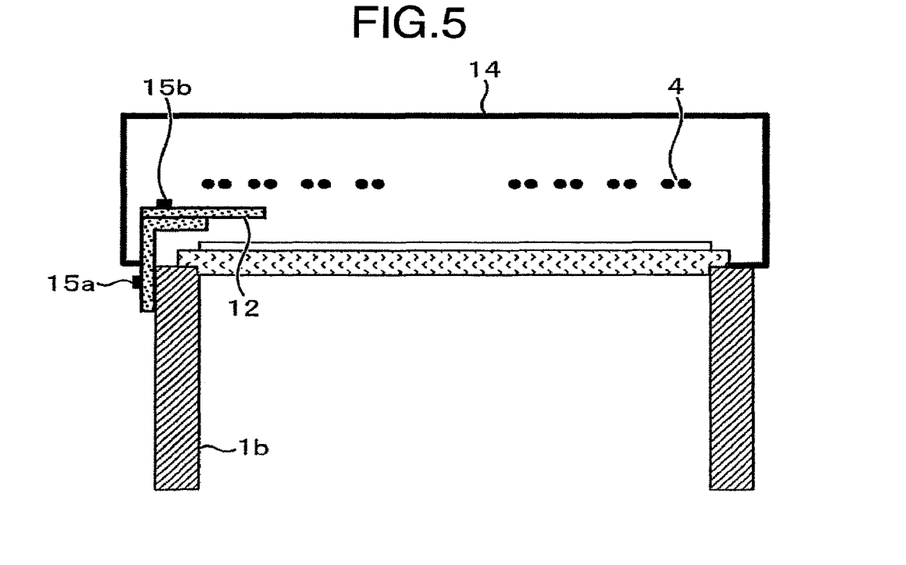
FIG. 5 is a longitudinal sectional view for explaining a setting method (1) for the conductor according to the present invention taken along D-D in FIG. 4.

FIG. 5 is a longitudinal sectional view taken along D-D in FIG. 4 and shows an attachment state of the conductor 12. The conductor 12 is fixed to the processing container 1b by bolts 15a and 15b as shown in FIG. 5. The conductor 12 can be adjusted to a desired position in the horizontal direction and the vertical direction by changing the positions of the bolts 15a and 15b.

Figure 6:
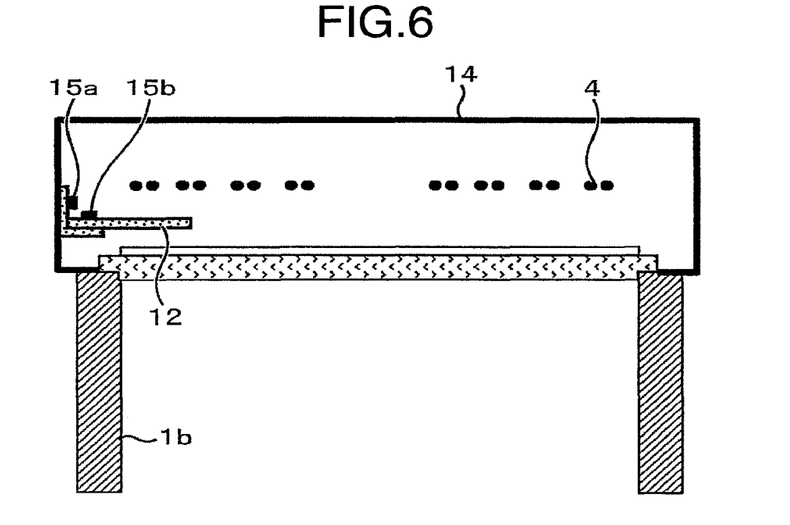
FIG. 6 is a longitudinal sectional view for explaining a setting method (2) for the conductor according to the present invention taken along D-D in FIG. 4.

In FIG. 5, the conductor 12 is fixed to the processing container 1b. However, since a closed circuit in which the induction current flows only has to be formed, for example, as shown in FIG. 6, the conductor 12 may be fixed to the wall surface of an induction coil protection cover 14 that covers the induction coil 4d. However, the processing container 1b is grounded and the induction coil protection cover 14 is grounded via the processing container 1b. The induction coil protection cover 14 may be directly grounded. The material of the induction coil protection cover 14 is a conductor.

For the correction of the induction magnetic field generated from the induction coil 4, it is essential to generate the induction current in the conductor 12. The conductor 12 described above is an example of a conductor that generates the induction current by conducting to the grounded object. However, the conductor 12 does not always need to conduct to the ground or the grounded object. The conductor 12 only has to have a shape in which the conductor 12 alone can generate the induction current. In other words, the conductor 12 only has to have a shape for generating a circular induction current.

Figure 7:
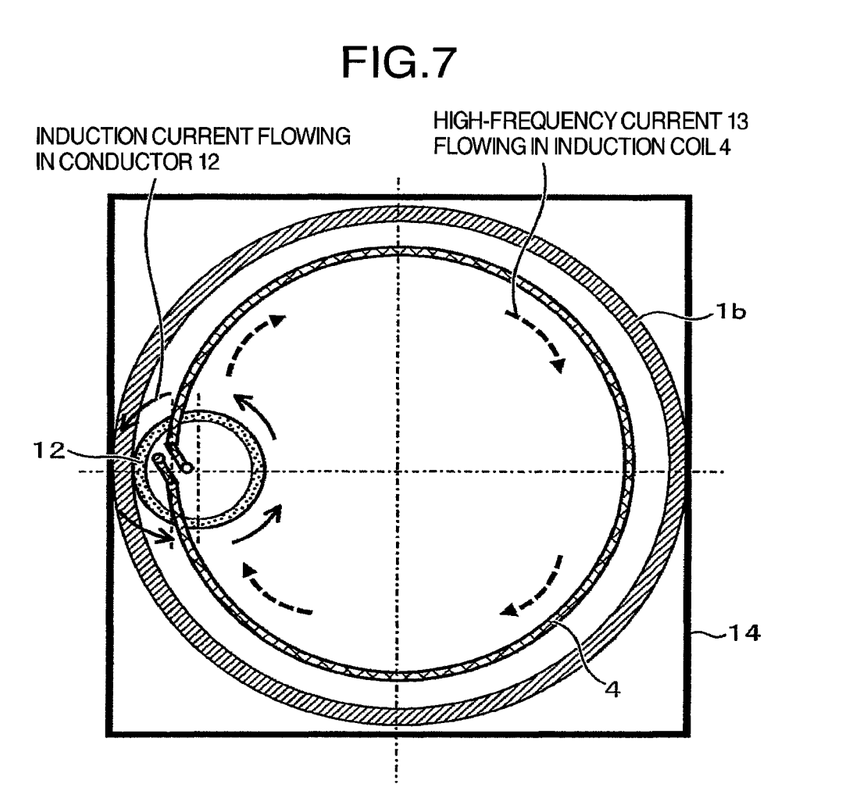
FIG. 7 is a plan view of the conductor according to the present invention formed as a ring-like conductor.

For example, as shown in FIG. 7, when the induction coil 4 is a one-turn induction coil, the conductor 12 having a ring shape is set to surround the power feeding sections of the induction coil 4, whereby the induction current flows to the conductor 12 as well in a direction for cancelling an induction electric field generated from the induction coil 4.

Figure 8:
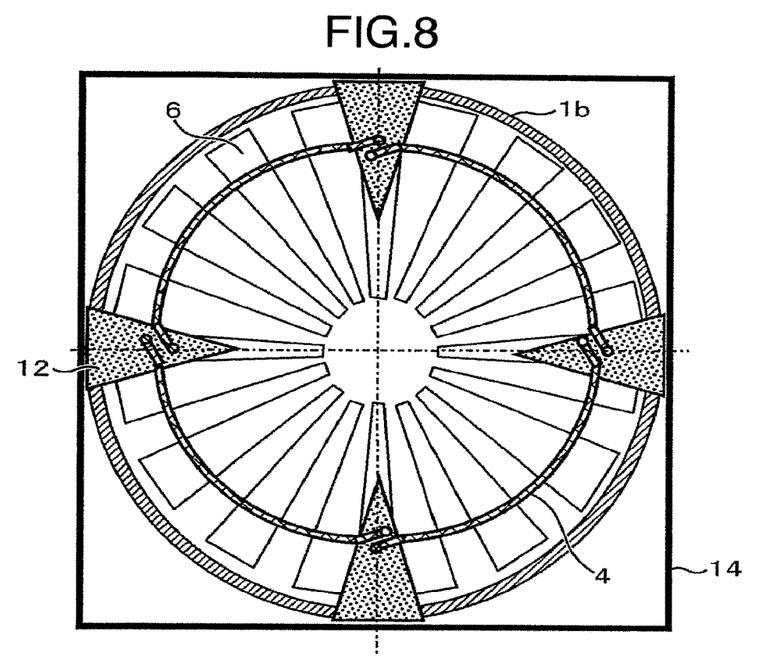
FIG. 8 is a diagram for explaining a method (1) of setting a plurality of the conductors according to the present invention.

Further, as shown in FIG. 8, when the induction coil 4 is an induction coil having the power feeding sections at every 90 degrees in one turn, if the conductors 12 are arranged in lower parts near the power feeding sections along the circumferential direction of the induction coil 4, it is possible to correct induction magnetic fields of the power feeding sections. Non-uniformity of plasma in the circumferential direction of the induction coil 4 can be solved more than the one-turn induction coil including one power feeding section.

Figure 9:
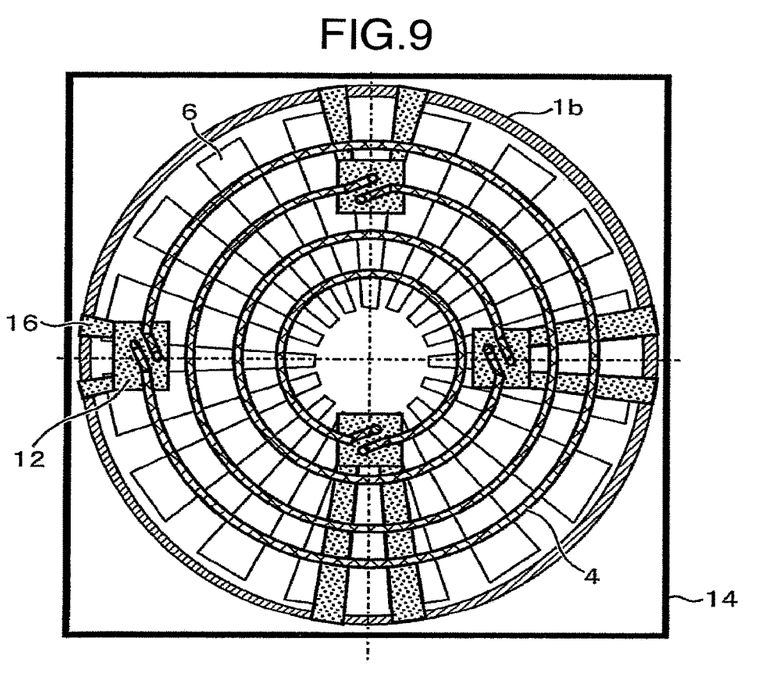
FIG. 9 is a diagram for explaining a method (2) of setting a plurality of conductors according to the present invention.

When the induction coil 4 includes four induction coils, each of which is one-turn and has one power feeding section, and the positions of the power feeding sections of the respective induction coils are different in the circumferential direction, as shown in FIG. 9, it is advisable to form the conductor 12 in a square shape and arrange the conductor 12 to extend from a place where the square portion of the conductor 12 is located right under the power feeding sections to conduct to the power feeding sections (in this case the processing container 1b) to a predetermined position. In this case, in the case of the induction coil arranged on the inner side, in a portion on the outer side of the induction coil, a support section 16, which supports the square portion to be projected to a non-slit portion, is provided not to close the slit portion of a Faraday shield 15.

In a place of the conductor 12 where a square tabular member is unnecessary, a slit is provided to match the slit shape of the Faraday shield 15. In this way, the number of combinations of the conductors 12 and the power feeding sections and the shape of the conductor 12 only have to be optimized such that a desired induction magnetic field distribution is obtained.

A not-shown supply path for a processing gas is formed on the inner side of the vacuum processing chamber of the dielectric window 1a. A gas supply device 9 is connected to the supply path. In the vacuum processing chamber 1, a specimen table 3 is set to be supported in the processing container 1b by a not-shown supporting member. A specimen placing surface is formed on the upper surface of the specimen table 3. A specimen 2 is arranged on the specimen placing surface by a not-shown conveying device. The specimen 2 can be held by electrostatic attraction or the like. A second radio-frequency power supply 11 is connected to the specimen 2, which is arranged on the upper surface of the specimen table 3, such that a bias voltage can be applied to the specimen 2 during processing of the specimen. The second radio-frequency power supply 11 generates, radio-frequency power having a frequency lower than the frequency of the first radio-frequency power supply 8, for example, 800 KHz or 4 MHz. An exhaust device 10 that decompresses and exhausts the vacuum processing chamber 1 is attached to the lower surface of the processing container 1b.

In the plasma processing apparatus configured as explained above, first, the vacuum processing chamber 1 is decompressed and exhausted by the exhaust device 10 and, at the same time, the processing gas subjected to flow rate control by the gas supply device 9 is supplied into the vacuum processing chamber 1 via the dielectric window 1a to set the inside of the vacuum processing chamber 1 to predetermined pressure. Subsequently, radio-frequency power is supplied to the induction coils 4a to 4d by the first radio-frequency power supply 8 via the matching unit 7.

Consequently, plasma of the processing gas is generated in the vacuum processing chamber 1. Electric powers respectively supplied to the induction coils 4a to 4d can be adjusted by a not-shown control device on the basis of a plasma distribution in the vacuum processing chamber 1.

An induction magnetic field radiated from the induction coil 4 is subjected to the actions of the conductor 12 and the Faraday shield 6, transmitted through the dielectric window 1a, and propagated into the vacuum processing chamber 1.

Figure 10:
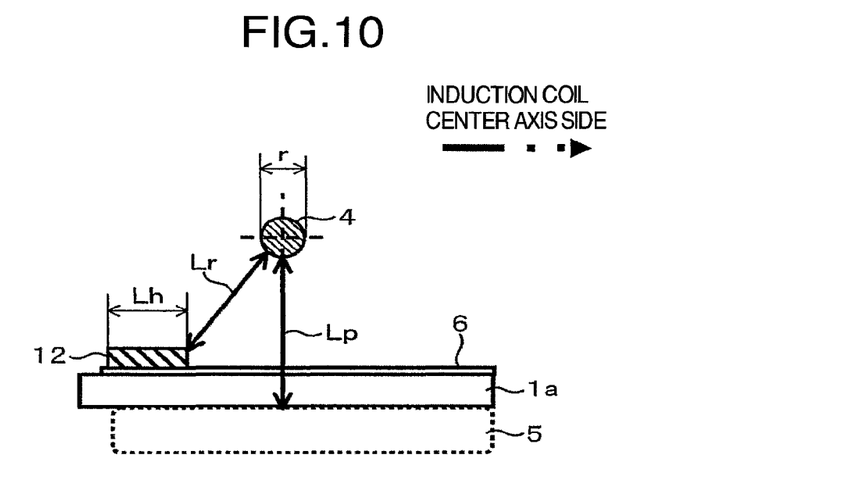
FIG. 10 is a diagram showing a positional relation among the conductor, the induction coil, and the plasma according to the present invention.

The action exerted by the conductor 12 is explained with reference to FIGS. 10 and 11. As explained above, the conductor 12 is provided on the Faraday shield 6. When the shortest distance from the induction coil 4 to the surface of the conductor 12 is represented as Lr and the shortest distance from the induction coil 4 to plasma 5 generated right under the dielectric window 1a is represented as Lp, in the power feeding sections of the induction coil, the conductor 12 is set in a position where Lp≥Lr is satisfied. Since the position of the conductor 12 is set in the position where Lp≥Lr is satisfied with respect to the power feeding sections of the induction coil 4, it is possible to locally change mutual inductance between the induction coil 4 and the plasma.

A relation between the distances Lp and Lr is explained with reference to the setting position of the conductor 12 and an induction magnetic field intensity distribution using a simulation result. FIGS. 11A to 11C are diagrams showing, with contour lines, an induction magnetic field distribution generated from the induction coil 4 when an electric current of 10 A/m is constantly fed to the induction coil 4. The contour lines shown in FIGS. 11A to 11C indicate that the induction magnetic field intensity is low in portions with lighter colors (a portion having the lowest induction magnetic field intensity is hatched) and, conversely, the induction magnetic field intensity is high in portions with darker colors. Usually, an induction magnetic field generated from the induction coil 4 is transmitted through the dielectric window 1a and reaches the inside of the vacuum processing chamber 1 while spreading in a concentric circle shape from the induction coil 4. The induction magnetic field distribution is generally distribution similar to contour lines of the induction magnetic field intensity shown in FIG. 11C.

Figure 11A:
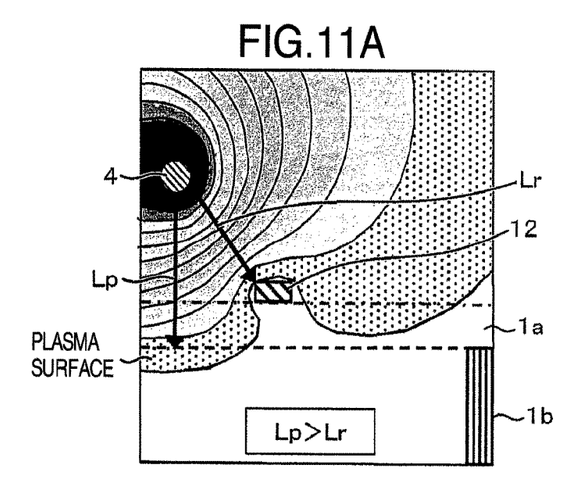
FIGS. 11A to 11C are simulation diagrams showing an induction magnetic field distribution depending on the position of the conductor according to the present invention.

In FIG. 11A, a simulation result obtained when the conductor 12 is set in a position where Lp>Lr is satisfied is shown. In the position where the conductor 12 is set, an induction magnetic field generated by the induction coil 4 is blocked by the conductor 12. Only an induction magnetic field on the inner side of the conductor 12, i.e., a side where the induction coil 4 is present reaches the dielectric window 1a side. This is because, as explained above, since the conductor 12 is arranged at the distance Lr closer to the induction coil 4 than the distance Lp to the plasma generation surface, an induction magnetic field stronger than an induction magnetic field used for plasma generation is cancelled by the action of the induction current generated in the conductor 12 to reduce an induction magnetic field in a region near the conductor 12.

Figure 11B:
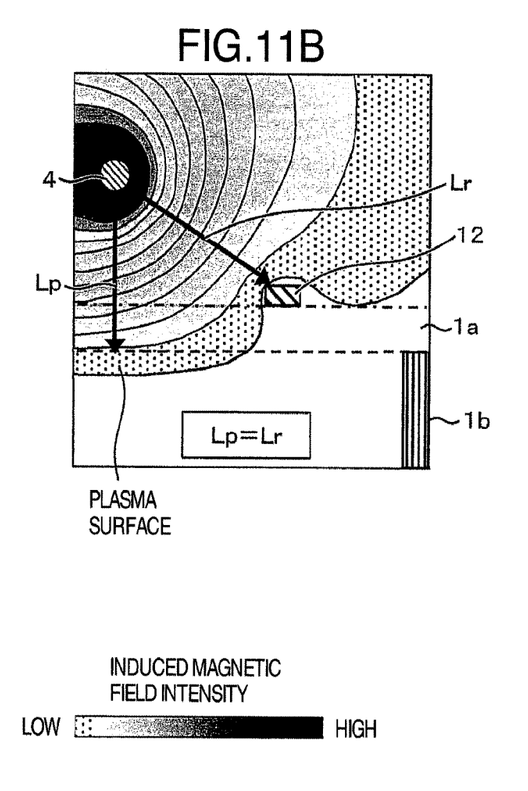
Figure 11C:
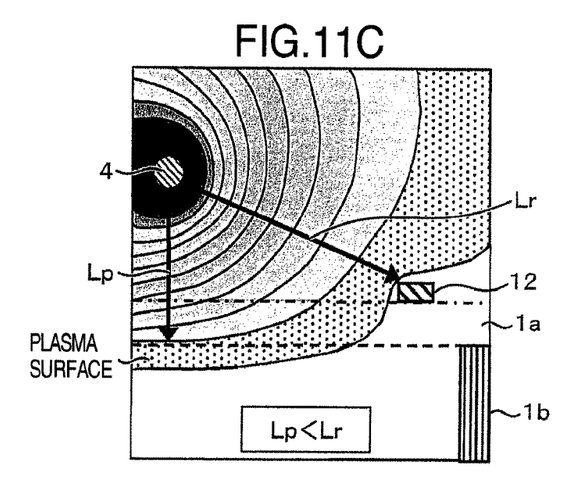

In FIG. 11B, a simulation result obtained when the conductor 12 is set in a position where Lp=Lr is satisfied is shown. In FIG. 11C, a simulation result obtained when the conductor 12 is set in a position where Lp<Lr is satisfied is shown. In FIGS. 11B and 11C, as in FIG. 11A, an induction current for blocking an induction magnetic field is generated in the position where the conductor 12 is set. However, it is seen that, as the conductor 12 is set farther away from the induction coil 4 as shown in FIGS. 11B and 11C, a region of an induction magnetic field reaching the inside of the vacuum processing chamber 1 increases.

Therefore, it is seen that a plasma region formed in the vacuum processing chamber 1 changes according to the attachment position of the conductor 12. In other words, a plasma forming region can be adjusted by adjusting the position of the conductor 12. When the position of the conductor 12 is in a relation of Lp<Lr, depending on the position of the induction coil 4d on the outermost side of the induction coil 4, this does not effectively act when plasma forming region extends to nearly the outer side as in this embodiment (when a value of processing chamber inner diameter (diameter D)−induction coil diameter (diameter d) is within about 2Lp). Therefore, it is effective to set the position of the conductor 12 in the position where Lp≥Lr is satisfied. It is possible to adjust the position of plasma generated right under the dielectric window 1a. Therefore, it is desirable to set the conductor 12 in a position below the induction coil 4 and where Lp≥Lr is satisfied.

In this way, the setting position of the conductor 12 is not limited to above the dielectric window 1a. The conductor 12 may be formed in the dielectric window 1a or may be provided on the lower surface of the dielectric window 1a. In other words, the conductor 12 only has to be arranged between the induction coil 4 and the plasma generation surface.

Figure 12A:
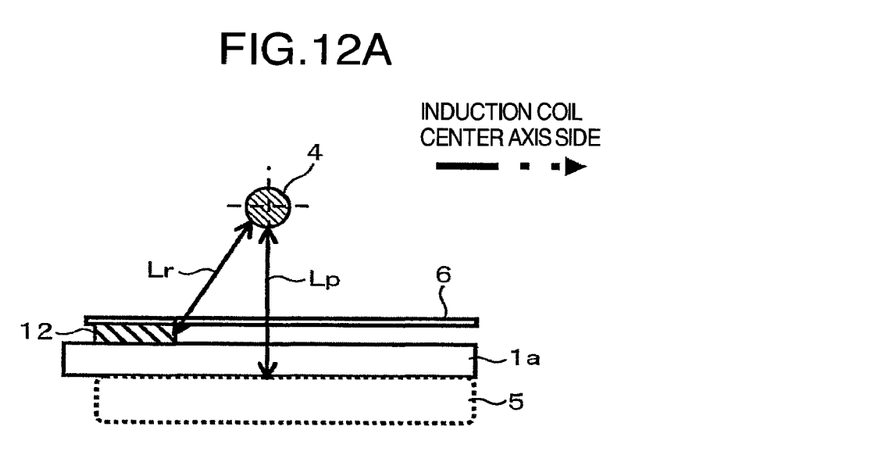
FIGS. 12A and 12B are diagrams showing a positional relation among the conductor, the induction coil, and the plasma according to the present invention.
Figure 12B:
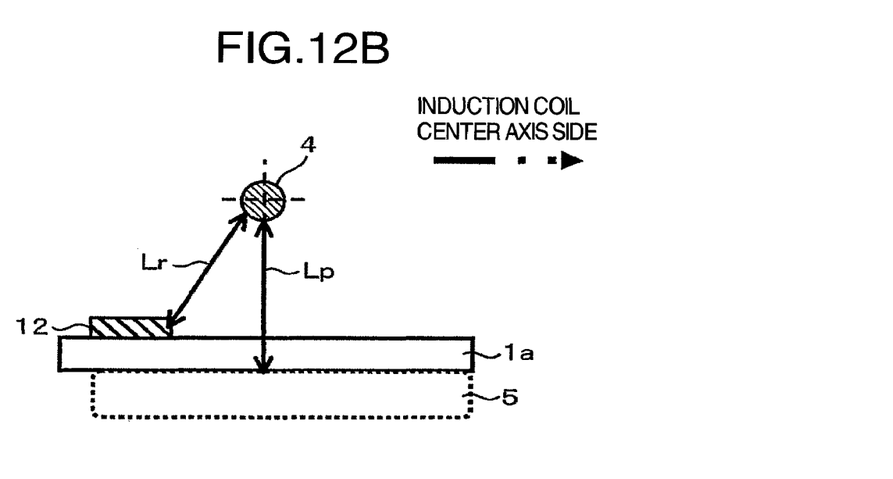

In this embodiment, the conductor 12 is arranged on the Faraday shield 6 between the induction coil 4 and the Faraday shield 6. However, the conductor 12 does not always need to be set between the induction coil 4 and the Faraday shield 6. As shown in FIG. 12A, the conductor 12 may be set between the Faraday shield 6 and the dielectric window 1a. Further, when the action of the Faraday shield 6 is unnecessary, as shown in FIG. 12B, the Faraday shield 6 may be removed and the conductor 12 only has to be set on the upper surface of the dielectric window 1a.

As explained above, in the present invention, the induction magnetic field generated in the power feeding sections locally having the crossing section can be set strongest on the circumference of the induction coil 4 according to the shape of the induction coil 4 according to this embodiment. The induction magnetic field strongest on the circumference of the induction coil 4 can be reduced by setting the conductor 12 below the power feeding sections. Therefore, according to the present invention, it is possible to solve non-uniformity of an induction magnetic field distribution in the circumferential direction of the induction coil. According to this improved induction magnetic field distribution, it is possible to solve non-uniformity of plasma in the circumferential direction of the induction coil 4 and apply uniform plasma processing to a specimen.

Figure 13A:
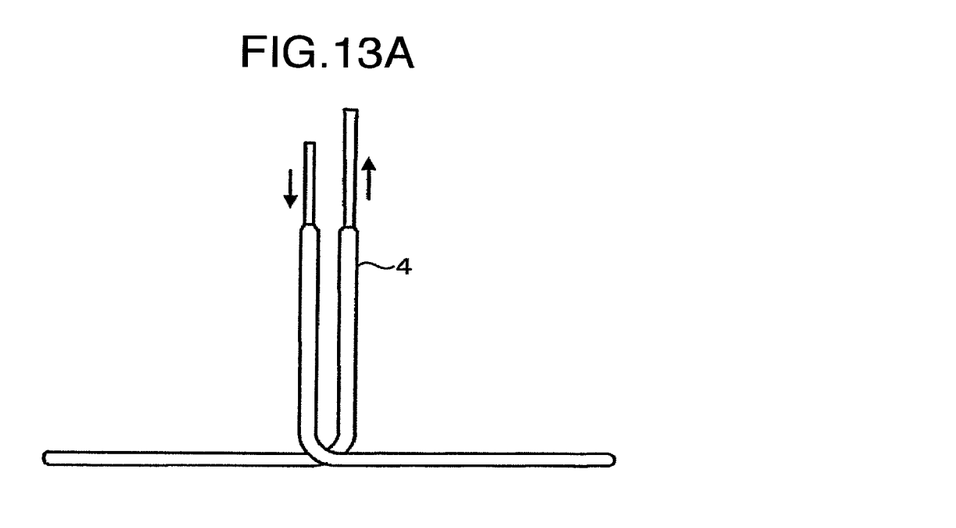
FIGS. 13A and 13B are longitudinal sectional views of the induction coil according to the present invention.
Figure 13B:
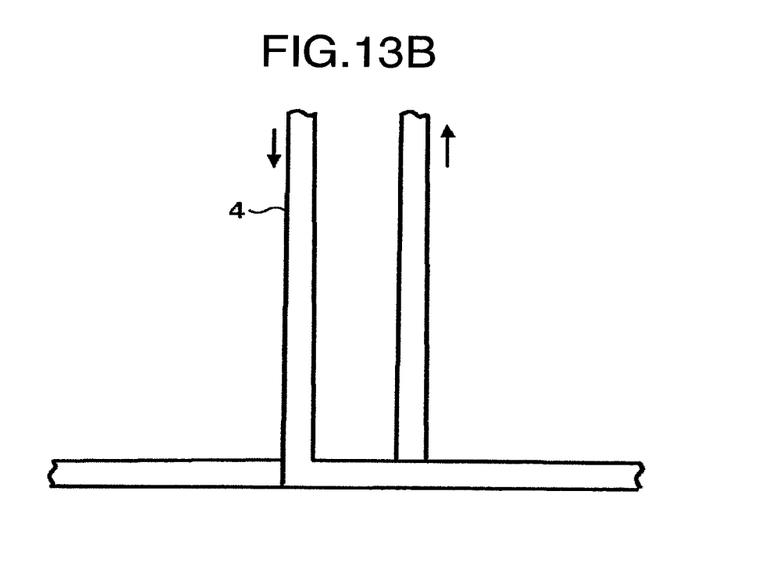

The induction coil 4 applied to the present invention only has to have a shape in which the power feeding sections cross. Therefore, the induction coil 4 is not limited to the shape shown in FIG. 13A. The induction coil 4 may have a shape in which the power feeding sections vertically cross as shown in FIG. 13B.

Further, in this embodiment, the Faraday shield 6 and the conductor 12 are separately provided. However, the Faraday shield 6 and the conductor 12 may be integrated with the functions thereof combined.

Figure 14:
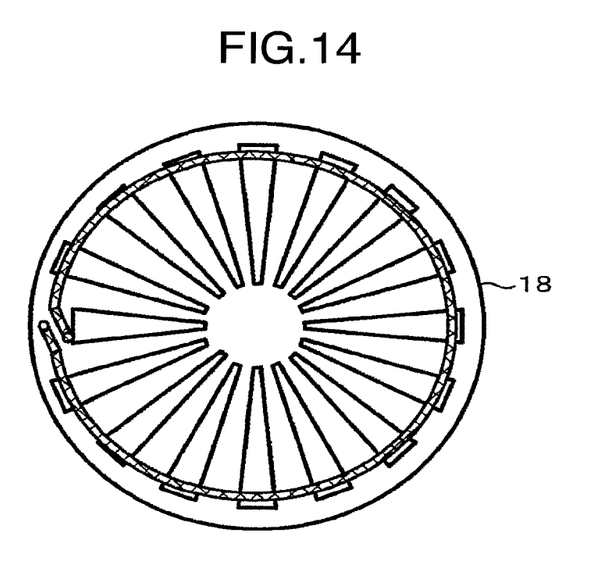
FIG. 14 is a plan view of an integral Faraday shield according to the present invention.

For example, an example of attachment of an integral Faraday shield 18 that enables correction of an induction magnetic field distribution in the power feeding sections of the induction coil 4 according to this embodiment is explained with reference to FIG. 14. Since the power feeding sections of the induction coil 4 according to this embodiment cross, the crossing section of the power feeding sections is a place where the intensity of an induction magnetic field is the highest in the circumferential direction. A weak induction magnetic field cannot be intensified. However, high magnetic field intensity can be reduced by forming a local circular induction current explained in this embodiment. It is possible to block the high magnetic field intensity of the power feeding sections and solve non-uniformity of plasma in the circumferential direction of the induction coil by closing slits in places opposed to the power feeding sections of the induction coil as shown in FIG. 14. In this embodiment, the induction coil 4 having one winding is used. However, an induction coil having plural windings may be used.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus comprising:
   a vacuum processing chamber for processing a specimen;
   a dielectric window forming an upper face of the vacuum processing chamber;
   a gas supply device for introducing a gas into the vacuum processing chamber;
   a specimen table arranged in the vacuum processing chamber to hold thereon the specimen;
   an induction coil arranged above the dielectric window; and
   a radio-frequency electric power source for supplying a radio-frequency electric power to the induction coil;
   wherein the plasma processing apparatus further comprises at least one electric conductor, each of the at least one electric conductor comprising a flat plate; and
   wherein the induction coil has at least one crossed electric power supply portion, and each of the at least one electric conductor is arranged between the at least one crossed electric power supply portion and a faraday shield.

2. The plasma processing apparatus according to claim 1, wherein the vacuum processing chamber is electrically grounded, and the electrical conductor is electrically connected to the vacuum processing chamber.

3. The plasma processing apparatus according to claim 1, wherein the electric conductor has a shape enabling a circulating induced electric current to be generated.

4. The plasma processing apparatus according to claim 1, wherein a number of the at least one electric conductor corresponds to a number of the at least one crossed electric power supply portion.

* * * * *